United States Patent

Sun et al.

(10) Patent No.: US 8,779,870 B2
(45) Date of Patent: Jul. 15, 2014

(54) LOW PHASE VARIATION CMOS DIGITAL ATTENUATOR

(75) Inventors: Pinping Sun, Essex Junction, VT (US); Hanyi Ding, Colchester, VT (US); Wayne H. Woods, Jr., Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 344 days.

(21) Appl. No.: 13/253,260

(22) Filed: Oct. 5, 2011

(65) Prior Publication Data

US 2013/0088403 A1    Apr. 11, 2013

(51) Int. Cl.
- *H03L 5/00* (2006.01)
- *H03H 7/24* (2006.01)
- *H01P 1/22* (2006.01)

(52) U.S. Cl.
CPC .. *H01P 1/22* (2013.01); *H03H 7/24* (2013.01); *H03L 5/00* (2013.01)
USPC ...................................................... 333/81 R

(58) Field of Classification Search
USPC .................. 333/81 R; 327/308, 309
See application file for complete search history.

(56) References Cited

U.S. PATENT DOCUMENTS 6,300,814 B1 * 10/2001 Takahashi ...................... 327/308
6,828,873 B2 * 12/2004 Ludwig et al. .............. 333/81 R

OTHER PUBLICATIONS

Min, B.W. et al., "A 10-50-GHz CMOS Distributed Step Attenuator with Low Loss and Low Phase Imbalance" IEEE Journal of Solid-State Circuits (Nov. 2007) pp. 2547-2554, vol. 42, No. 11.

Ku, B.H. et al., "6-bit CMOS Digital Attenuators with Low Phase Variations for X-Band Phased-Array Systems" IEEE Transactions on Microwave Theory and Techniques (Jul. 2010) pp. 1651-1663, vol. 58, No. 7.

Dogan, H. et al., "Analysis and Design of RF CMOS Attenuators" IEEE Journal of Solid-State Circuits (Oct. 2008) pp. 2269-2283, vol. 43, No. 10.

Dai, Y.S. et al., "A Novel UWB (0.045-50 GHz) Digital/Analog Compatible MMIC Variable Attenuator with Low Insertion Phase Shift and Large Dynamic Range" IEEE Microwave and Wireless Components Letters (Jan. 2007) pp. 61-63, vol. 17, No. 1.

\* cited by examiner

*Primary Examiner* — Stephen Jones
(74) *Attorney, Agent, or Firm* — Scully, Scott, Murphy & Presser, P.C.; H. Daniel Schnurmann

(57) ABSTRACT

A low phase variation attenuator uses a combined attenuation path and a phase network to significantly reduce a phase error between a reference signal and an attenuated signal without degrading the insertion loss. A grounded parallel connection of a resistor and a capacitor is employed in series with an attenuation transistor, which is connected to a middle of a two resistor voltage divider. The two resistor voltage divider includes two resistors of equal resistance that are connected in a series connection. The two resistor voltage divider is connected in a parallel connection with a reference transistor, which functions as a main switch for the transmission or attenuation of a radio frequency (RF) signal.

19 Claims, 9 Drawing Sheets

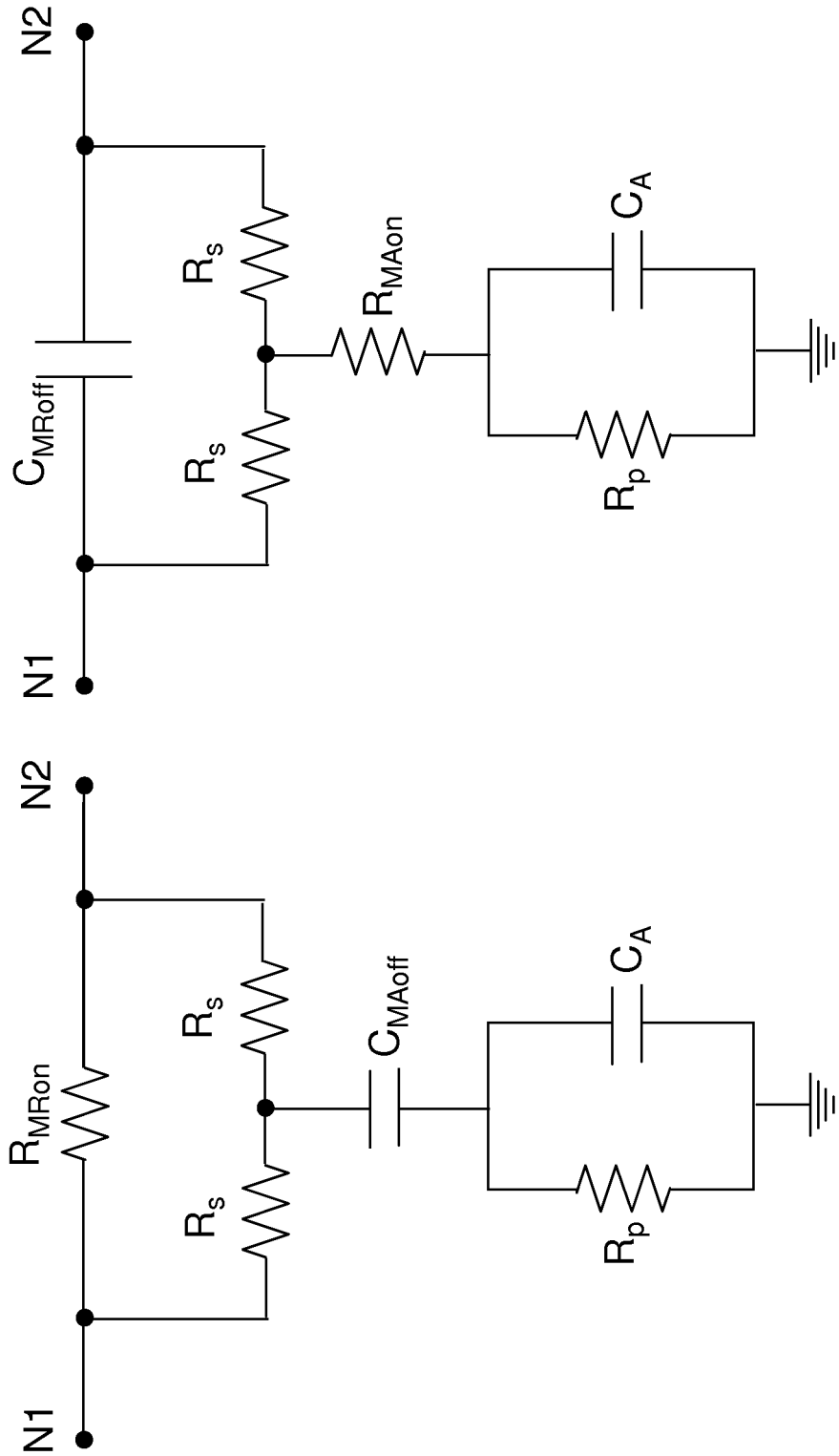

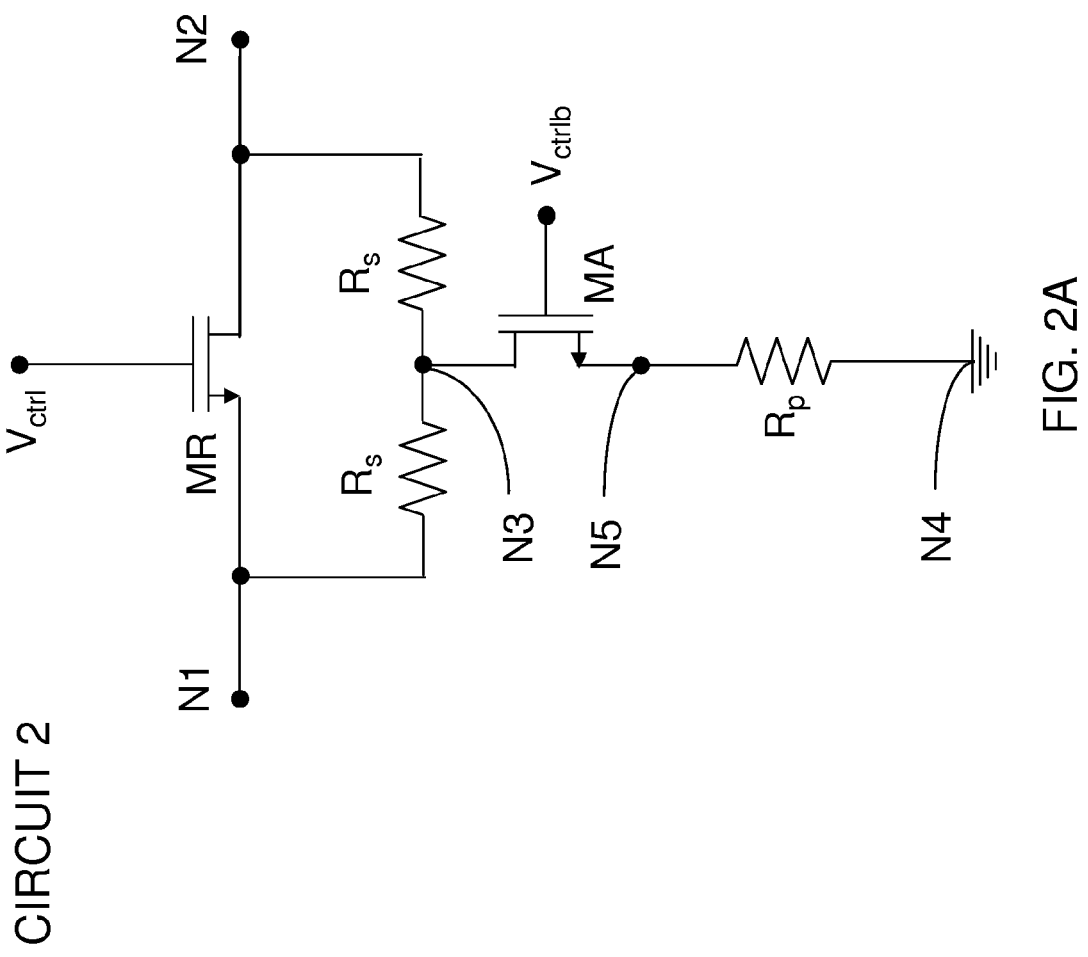

LOW PHASE VARIATION CMOS DIGITAL ATTENUATOR

BACKGROUND

The present disclosure generally relates to a semiconductor circuit, and particularly to a semiconductor circuit including an attenuator for reducing a phase difference between transmission phase and attenuation phase of a signal, and a method of designing such a circuit.

Amplitude control circuits such as variable attenuators have been one of the key components in many electronic circuit systems, such as an automatic gain control component in transmitter/receiver systems and an amplitude weighting component in phased-array radars. In phased-array antennas and beam-forming systems, accurate and wide amplitude control is required to adjust the side lobe levels and null points precisely. Constant transmission phase during amplitude control is required to avoid tracking errors and complex phase/amplitude calibrations.

Various digital attenuators have been previously proposed. In other types of attenuators known in the art, however, attempts to reduce variations in phase between a transmission signal and an attenuated signal tend to result in significant increase in the insertion loss and the design complexity.

BRIEF SUMMARY

A low phase variation attenuator uses a combined attenuation path and a phase network to significantly reduce a phase error between a reference signal and an attenuated signal without degrading the insertion loss. A grounded parallel connection of a resistor and a capacitor is employed in series with an attenuation transistor, which is connected to a middle of a two resistor voltage divider. The two resistor voltage divider includes two resistors of equal resistance that are connected in a series connection. The two resistor voltage divider is connected in a parallel connection with a reference transistor, which functions as a main switch for the transmission or attenuation of an alternating current (AC) signal. The low phase variation attenuator can provide an insertion loss less than 1 dB insertion, while providing a phase difference between a transmitted signal and an attenuated signal, for example, less than 2 degrees over a frequency range from 10 GHz to 20 GHz.

According to an aspect of the present disclosure, an attenuator circuit includes: a parallel connection of a reference transistor and two resistors between a first node and a second node; and a series connection of an attenuation transistor and a complex impedance circuit. A third node at one end of the series connection is a node between the two resistors. A fourth node at another end of the series connection is electrically grounded.

According to another aspect of the present disclosure, a method of designing an attenuator circuit includes: generating a circuit design for an attenuator circuit, determining, employing a computing device, values for components of the attenuator circuit; and storing the circuit design and the values in a non-transitory machine-readable data storage medium. The attenuator circuit includes: a parallel connection of a reference transistor and two resistors between a first node and a second node, and a series connection of an attenuation transistor and a complex impedance circuit. A third node at one end of the series connection is a node between the two resistors. A fourth node at another end of the series connection is electrically grounded. The complex impedance circuit can be a parallel connection of a resistor and a capacitor. The values for components of the attenuator circuit can include values of components in the complex impedance circuit.

BRIEF DESCRIPTION OF THE SEVERAL VIEWS OF THE DRAWINGS

FIG. 1B is a schematic of an equivalent circuit for the first circuit in a transmission mode.

FIG. 1C is a schematic of an equivalent circuit for the first circuit in an attenuation mode.

FIG. 2A is a schematic of a second circuit, which is a comparative example for the first circuit.

DETAILED DESCRIPTION

Figure 1A:
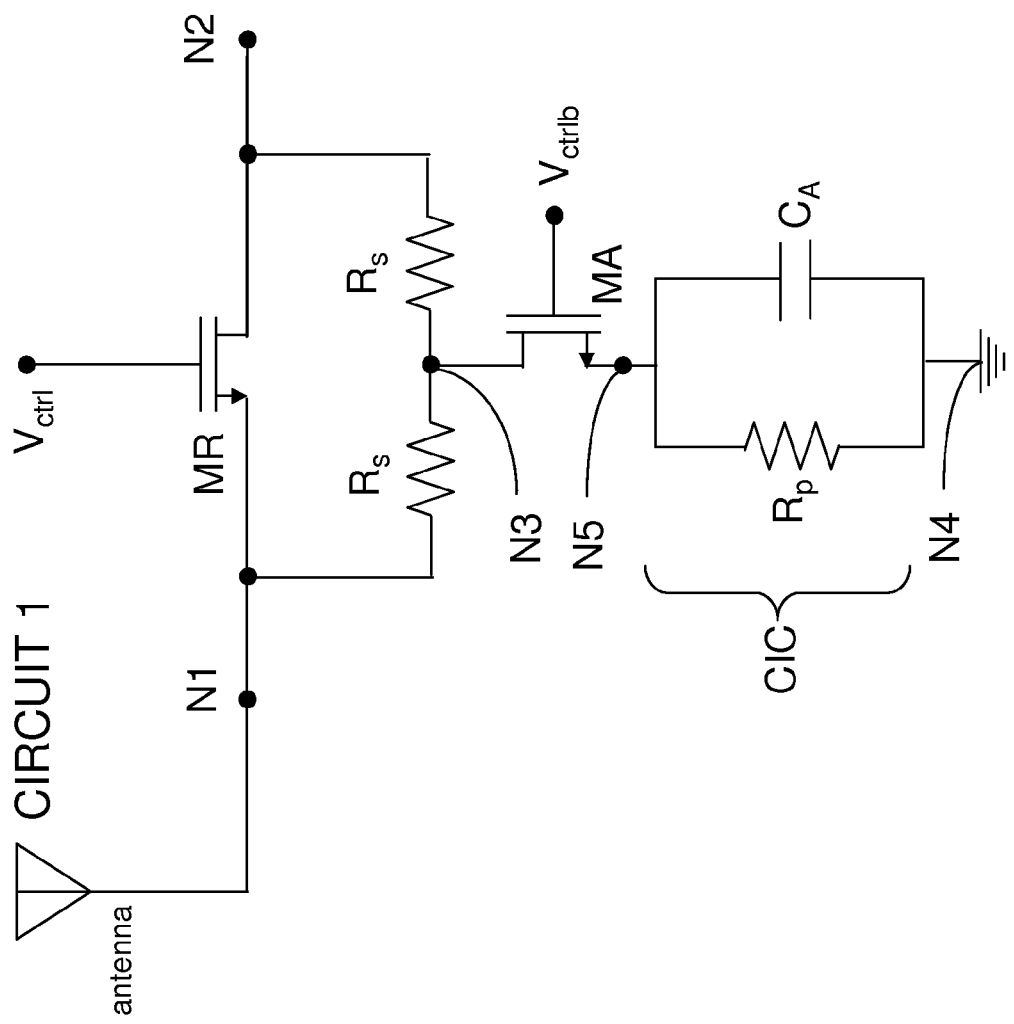
FIG. 1A is a schematic of a first circuit according to an embodiment of the present disclosure.

As stated above, the present disclosure relates to a semiconductor circuit including an attenuator for reducing a phase difference between transmission phase and attenuation phase of a signal, and a method of designing such a circuit. It is noted that like reference characters refer to like elements across different embodiments. The drawings are not necessarily drawn to scale.

A low phase variation complementary metal oxide semiconductor (CMOS) attenuator circuit can provide a low phase variation between a reference signal transmitted through a reference path and an attenuated signal transmitted through an attenuation path without degrading insertion loss. The low phase variation CMOS attenuator circuit can include two transistors and a parallel connection of a resistor and a capacitor between one of the two transistors and electrical ground. In one embodiment, the low phase variation CMOS attenuator circuit can provide an insertion loss less than 1 dB in an operating frequency range from 10 GHz to 20 GHz. The phase variance between the reference signal and the attenuated signal can be. for example, from −2 degrees to +2 degrees, which is an order of magnitude improvement from other types of attenuators known in the art.

As used herein, an "operating frequency range" refers to the frequency range in which the amplitude of the attenuated signal is less than the amplitude of the reference signal. It is noted that the impedance of a capacitor approaches zero at high frequencies, and a transistor having the characteristic of a capacitor in an off-state can effectively be electrically shorted at extremely high frequencies, which are above the operating frequency range.

Referring to FIG. 1A, a first circuit according to an embodiment of the present disclosure includes an attenuator circuit including a first node N1 and a second node N2. The first node N1 can be an input node and the second node can be an output node. A reference transistor MR is provided between the first node N1 and the second node N2 such that a source of the reference transistor MR is the first node N1, and the drain of the reference transistor is the second node N2. The reference transistor MR is configured to be controlled by a signal applied to the gate of the reference transistor MR, i.e., to be turned on or off depending on the signal applied to the gate of the reference transistor MR. The signal applied to the gate of the reference transistor MR is herein referred to as a primary control voltage Vctrl.

In one embodiment, the source and the drain of the reference transistor MR can be physically symmetric. In this case, the portion of the first circuit between the first node N1 and the second node N2 can be symmetric. The first circuit can be employed in a mode in which the input node and the output node are switched, i.e., the first node N1 can function as the output node and the second node N2 can function as the input node. In one embodiment, the switching of the input node and the output node can occur during operation of the first circuit.

The first circuit further includes two resistors that are connected in a series connection between the first node N1 and the second node N2. The two resistors can have the same nominal resistance Rs in a design for the first circuit, i.e., the same target resistance value for resistance in the design for the first circuit. In practice, due to inherent variability of resistance of any manufactured component in semiconductor technology, the actual resistance of the two resistors can be within 10% of the nominal resistance Rs in a physical circuit implementing the design. In one embodiment, the two resistors as implemented in a manufactured attenuation circuit can have actual resistance values that are within 20% of each other.

In one embodiment, an antenna may be optionally provided to provide a signal to the first node N1.

The reference transistor MR and the two resistors are connected to each other in a parallel connection between the first node N1 and the second node N2. Further, the first circuit includes a series connection of an attenuation transistor MA and a complex impedance circuit CIC. The attenuation transistor MA is configured to be controlled by a signal applied to the gate of the attenuation transistor MA, i.e., to be turned on or off depending on the signal applied to the gate of the attenuation transistor MA. The signal applied to the gate of the attenuation transistor MA is herein referred to as a complementary control voltage Vctrlb. A third node N3 at one end of the series connection is a node between the two resistors. A fourth node N4 at another end of the series connection is electrically grounded.

As used herein, a "complex impedance circuit" refers to a circuit having two nodes such that the impedance between the two nodes is a complex number. In other words, a sinusoidal alternating current between the two nodes of a "complex impedance circuit" has a non-zero phase difference relative to a sinusoidal alternating voltage between the two nodes at one or more frequencies.

The reference transistor MR can be a metal oxide semiconductor field effect transistor as known in the art. The reference transistor MR can be an n-type MOSFET in which minority carriers in the channel are electrons, or can be a p-type MOSFET in which minority carriers in the channel are holes. The gate of the reference transistor MR is controlled by a control voltage Vctrl. Depending on the voltage level of the control voltage Vctrl, the reference transistor MR can be turned on or turned off.

In one embodiment, the primary control voltage Vctrl and the complementary control voltage Vctrlb are coupled to each other so as to set the reference transistor MR and the attenuation transistor MA at the opposite states. Thus, if the primary control voltage Vctrl is at a high state, e.g., at a voltage that turns on the reference transistor MR, the complementary control voltage Vctrlb is at a low state, e.g., at a voltage that turns off the attenuation transistor MA, and vice versa.

Therefore, if the reference transistor MR and the attenuation transistor MA are transistors of the same type, i.e., n-type field effect transistors or p-type field effect transistors, the complementary control voltage Vctrlb is the opposite of the primary control voltage Vctrl. For example, when the primary control voltage Vctrl is at a positive power supply voltage VDD, and the complementary control voltage Vctrlb is the voltage of electrical ground, and vice versa.

If the reference transistor MR and the attenuation transistor MA are transistors of different types, i.e., one is an n-type field effect transistors and the other is a p-type field effect transistors, the complementary control voltage Vctrlb can be the same as primary control voltage Vctrl. For example, when the primary control voltage Vctrl and the complementary control voltage Vctrlb are either simultaneously at a positive power supply voltage or at the voltage of electrical ground.

When the reference transistor MR is turned on, the reference path is in a reference mode, and the voltage level at the second node N2 can be degraded from the voltage level at the first node N1 by a certain amount, often in term of insertion loss by converting the voltage ratio to dB using 20*log(V at N1/V at N2). In one embodiment, the insertion loss can be less than 2 dB in a frequency range from 10 GHz to 20 GHz.

While the reference transistor MR is turned on, the impedance of the reference transistor MR can be approximated by a resistor having an equivalent resistance. The equivalent resistance of the reference transistor MR in the on-state is herein referred to as an on-state reference resistance $R_{MRon}$. While the reference transistor MR is turned off, the impedance of the reference transistor MR is best approximated by a capacitor having an equivalent capacitance. The equivalent capacitance of the reference transistor MR in the off-state is herein referred to as an off-state reference capacitance $C_{MRoff}$.

Likewise, while the attenuation transistor MA is turned on, the impedance of the attenuation transistor MA can be approximated by a resistor having an equivalent resistance. The equivalent resistance of the attenuation transistor MA in the on-state is herein referred to as an on-state attenuation resistance $R_{MAon}$. While the attenuation transistor MA is turned off, the impedance of the attenuation transistor MA is best approximated by a capacitor having an equivalent capacitance. The equivalent capacitance of the attenuation transistor MA in the off-state is herein referred to as an off-state attenuation capacitance $C_{MAoff}$.

In the embodiment in which the primary control voltage Vctrl and the complementary control voltage Vctrlb are coupled to each other to set the reference transistor MR and the attenuation transistor MA in opposite states, the first circuit can be approximated by two equivalent circuits. Specifically, when the reference transistor MR is turned on and the attenuation transistor MA is turned off, the first circuit can be approximated by a reference state equivalent circuit illustrated in FIG. 1B, in which the reference transistor MR is approximated by a resistor having the an on-state reference resistance $R_{MRon}$, and the attenuation transistor MA is approximated by a capacitor having the off-state attenuation capacitance $C_{MAoff}$. Likewise, when the reference transistor MR is turned off and the attenuation transistor MA is turned on, the first circuit can be approximated by an attenuation state equivalent circuit illustrated in FIG. 1C, in which the reference transistor MR is approximated by a capacitor having the an off-state reference capacitance $C_{MRoff}$, and the attenuation transistor MA is approximated by a resistor having the on-state attenuation resistance $R_{MAon}$.

In one embodiment, the complex impedance circuit CIC can be a parallel connection of a resistor having a resistance Rp and a phase-compensating capacitor having a capacitance $C_A$. The node between the attenuation transistor MA and the complex impedance circuit CIC is herein referred to as a fifth node N5. In this case, the frequency dependant complex impedance $Zc(\omega)$ of the complex impedance circuit CIS between the fifth node N5 and the fourth node N4 is given by:

$$Zc(\omega) = \frac{R_p}{1 + j\omega R_p C_A},$$

in which $\omega$ is the angular frequency of a sinusoidal electrical signal across the complex impedance circuit CIC.

Figures 2B, 2C:
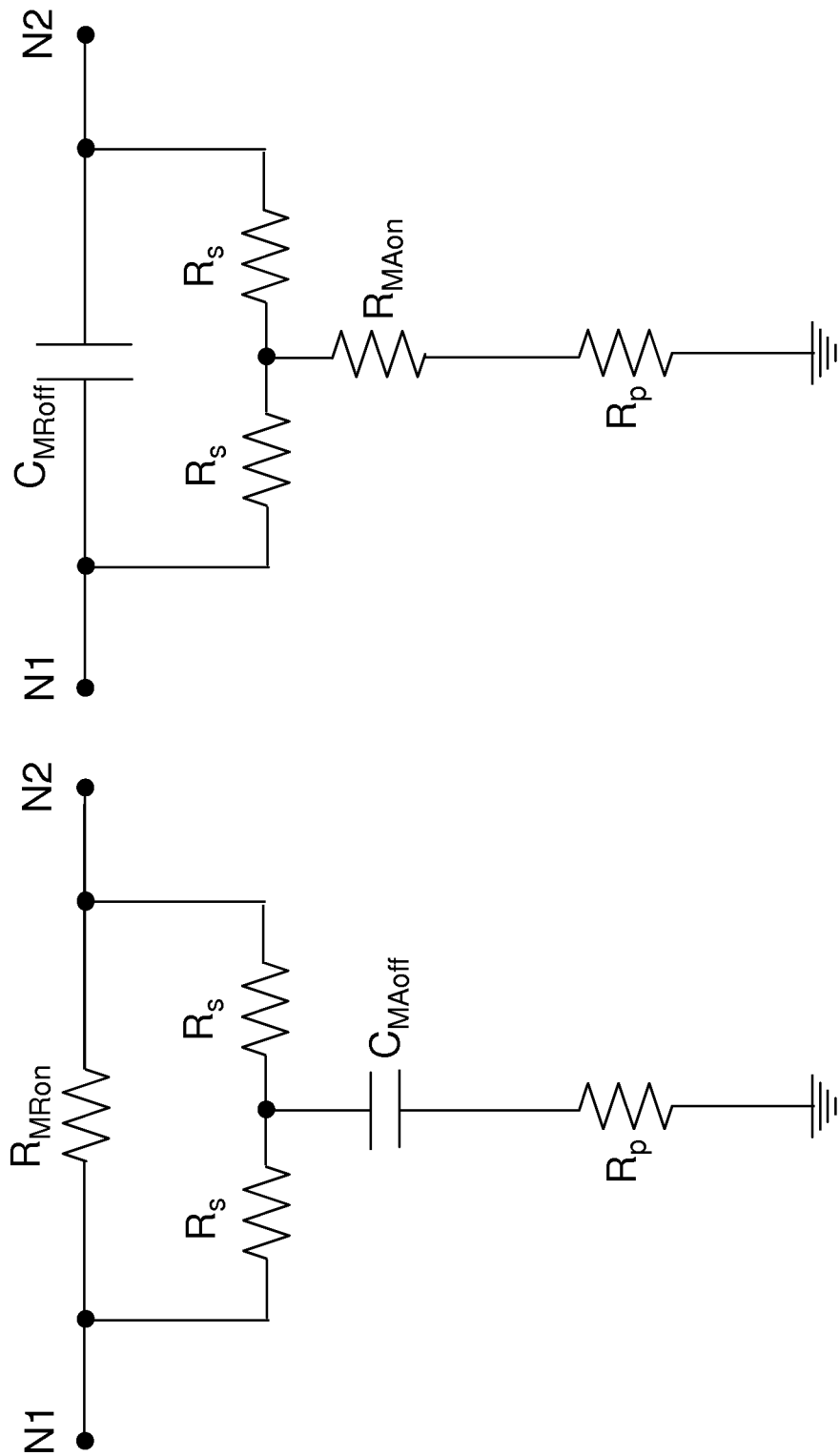
FIG. 2B is a schematic of an equivalent circuit for the second circuit in a transmission mode.
FIG. 2C is a schematic of an equivalent circuit for the second circuit in an attenuation mode.

The function of the phase-compensating capacitor is best illustrated by comparing the functionality of the first circuit with a second conventional circuit without the phase-compensating capacitor. The second circuit is illustrated in FIG. 2A, which does not include the phase-compensating capacitor that is present in the first circuit. In other words, in the second circuit illustrated in FIG. 2A, a single resistor having the resistance Rp replaces the complex impedance circuit CIC in the first circuit illustrated in FIG. 1A. A reference state equivalent circuit for the second circuit is illustrated in FIG. 1B, and an attenuation state equivalent circuit for the second circuit is illustrated in FIG. 1C, respectively.

When a signal is applied to the first node N1 of the first circuit, a signal is generated at the second node N2. When the reference transistor MR is turned on and the attenuation transistor MA is turned off, the first circuit is in a "reference mode," and the signal at the second node N2 is herein referred to as a "reference signal." The reference signal at the second node N2 is phase shifted relative to the applied signal at the first node N1 as a function of the angular frequency of the applied signal because of the presence of two complex impedances, which include the impedance provided by the capacitance of off-state attenuation capacitance $C_{MAoff}$ and the frequency dependant complex impedance $Zc(\omega)$, as illustrated in the reference state equivalent circuit for the first circuit in FIG. 1B.

Likewise, when the reference transistor MR is turned off and the attenuation transistor MA is turned on, the first circuit is in an "attenuation mode," and the signal at the second node N2 is herein referred to as an "attenuated signal." The attenuated signal at the second node N2 is phase shifted relative to the applied signal at the first node N1 as a function of the angular frequency of the applied signal because of the presence of two complex impedances, which include the impedance provided by the capacitance of off-state reference capacitance $C_{MRoff}$ and the frequency dependant complex impedance $Zc(\omega)$, as illustrated in the attenuation state equivalent circuit for the first circuit in FIG. 1C.

Thus, the frequency dependant complex impedance $Zc(\omega)$ provided by the complex impedance circuit CIC combining with $C_{MAoff}$ or $R_{MAon}$ shifts the phase of the reference signal generated at the second node N2 and the phase of the attenuated signal generated at the second node N2 relative to the phase of the applied signal at the first node N1, which can be generated either by an electronic circuit or by a signal captured by an antenna. However, the amount (measured in degrees) of the phase shift due to the frequency dependant complex impedance $Zc(\omega)$ in the reference signal at the second node N2 is different from the amount of the phase shift because two different additional impedances are involved in determining the phase shift at the second node N2 (relative to the phase of the applied signal at the first node N1) depending on whether the first circuit in the reference mode or in the attenuation mode. Specifically, the impedance provided by the capacitance of off-state attenuation capacitance $C_{MAoff}$ affects the phase shift in the reference mode, and the impedance provided by the capacitance of off-state reference capacitance $C_{MRoff}$ affects the phase shift in the attenuation mode.

Therefore, the capacitance $C_A$ of the phase-compensating capacitor that is provided in the first circuit shifts the phase of the attenuated signal, which is present at the second node N2 while the reference transistor MR is turned off, toward the phase of the reference signal, which is present at the second node N2 while the reference transistor MR is turned on, relative to the second circuit, which is the circuit derived from the first circuit by removing the phase-compensating capacitor. The effect of the capacitance $C_A$ of the phase-compensating capacitor is significant in a frequency range in which the quantity $\omega R_p C_A$ is significant relative to 1, i.e., in a frequency range in which w is not insignificant relative to $1/R_p C_A$. For example, the effect of the capacitance $C_A$ of the phase-compensating capacitor can be significant in a frequency range in which the frequency f is 1% to 10% of $1/(2\pi R_p C_A)$.

In one embodiment, the capacitance $C_A$ of the phase-compensating capacitor can be selected such that the capacitance $C_A$ shifts the attenuated signal in the first circuit in an entirety of a frequency range between 2 GHz and 200 GHz relative to the second circuit, which is the circuit derived from the first circuit by removing the phase-compensating capacitor.

Figure 3:
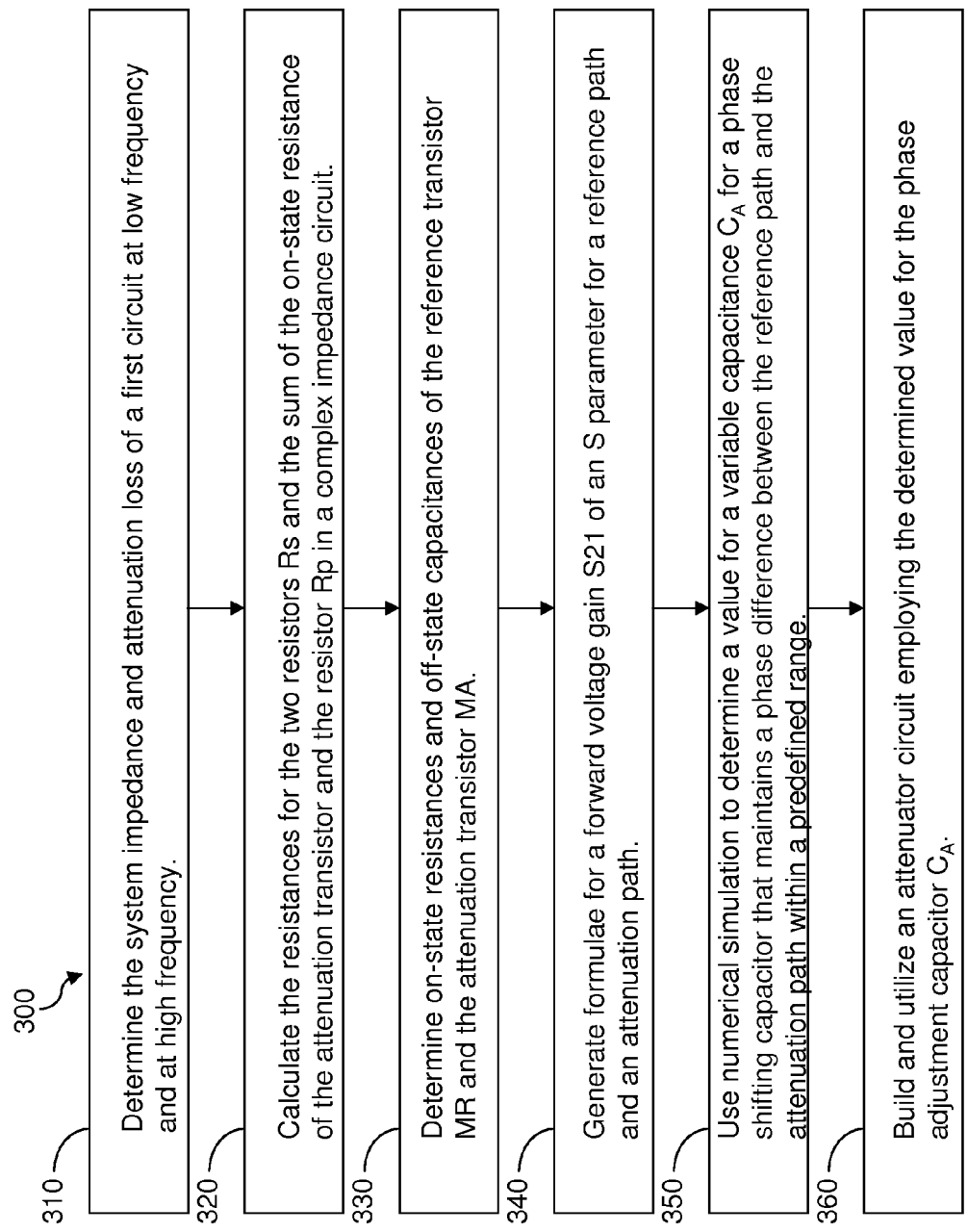
FIG. 3 is a flowchart illustrating steps for determining values for resistances and a capacitance of the first circuit according to an embodiment of the present disclosure.

In one embodiment, values for components of the first circuit including values of components in the complex impedance circuit CIC can be determined employing a computing device. Referring to FIG. 3, steps for determining values for resistances and the capacitance $C_A$ of the phase-compensating capacitor of the first circuit are described according to an embodiment of the present disclosure.

Referring to step 310, for a given first circuit illustrated in FIG. 1A, the characteristic impedance $Z_0$ and the magnitude of attenuation in decibel $A(\omega)$ of the first circuit are determined by specification of attenuator to be designed. The characteristic impedance $Z(\omega)$ is the ratio of the amplitudes of a single pair of voltage and current waves propagating along the line in the absence of reflections. The radio frequency (RF) market has standardized on several characteristic impedances, the most popular of which are 50 and 75Ω. The magnitude of attenuation in decibel $A(\omega)$ of the first circuit is the value obtained by multiplying 20 to the logarithm to base 10 of the ratio of the target magnitude (which is determined during the design phase of the circuit) of the sinusoidal voltage of the output at the second node N1 to the magnitude of the sinusoidal input voltage at the first node N2.

Referring to step 320, two quantities are determined based on the system specification, generated at step 310, or simulated values, for the characteristic impedance $Z_0$ and the target magnitude of attenuation in decibel $A(\omega)$. The first quantity is the nominal resistance Rs for the two resistors. The second quantity is $Rp+R_{MAon}$, i.e., the sum of the on-state resistance of the attenuation transistor MA (i.e., the on-state attenuation resistance $R_{MAon}$) and the resistance Rp of the resistor in the complex impedance circuit CIC.

In one embodiment, the characteristic impedance $Z_0$ and the target magnitude of attenuation in decibel $A(\omega)$ of the first circuit can be employed to determine the nominal resistance Rs for the two resistors and the resistance Rp of the resistor in the complex impedance circuit CIC.

Specifically, if the limiting values for the characteristic impedance $Z_0$ and the target magnitude of attenuation in decibel A of the first circuit at a low frequency limit are A(0), $$\lim_{\omega \to 0} A(\omega) = A$$

can determine the nominal resistance Rs for the two resistors and the sum of Rp and $R_{MAon}$ by:

$$Rs = Z_0 \times \left( \frac{10^{A/20} - 1}{10^{A/20} + 1} \right), \text{ and}$$

$$Rp + R_{MAon} = 2Z_0 \times \left( \frac{10^{A/20}}{10^{A/20} - 1} \right).$$

The limiting values $Z_0$ and A can be extrapolated by a series of alternating current (AC) measurements at the low frequency limit not including 0 Hz, or can be generated in direct current (DC) measurements.

In one embodiment, A can be a target attenuation, defined in decibels in the direct current mode, of an amplitude of an attenuated signal that is present at the second node N2 while the reference transistor MR is turned off relative to a reference signal that is present at the second node N2 while the reference transistor MR is turned on. $R_{MAon}$ is the on-state resistance of the attenuation transistor MA, which is determined by simulation or a measurement known in the art for measuring the on-state resistance of a transistor.

Referring to step 330, the two equivalent circuits of FIGS. 1B and 1C are fitted with a data set that includes the determined value for the nominal resistance Rs for the two resistors, the determined value for the sum of Rp and $R_{MAon}$, and the specified values of the characteristic impedance $Z_0$ and the target magnitude of attenuation in decibel $A(\omega)$ of the first circuit at various operating frequencies. The fitting can be performed employing a computing device. For example, a least mean square fitting method or any other fitting algorithm to minimize fitting errors can be employed to fit the two equivalent circuits of FIGS. 1B and 1C.

Specifically, the reference state equivalent circuit of FIG. 1B is fitted with a data subset that includes the determined value for the nominal resistance Rs for the two resistors, the determined value for the sum of Rp and $R_{MAon}$, and the measured or simulated values of the characteristic impedance $Z_0$ and the magnitude of attenuation in decibel $A(\omega)$ of the first circuit at various operating frequencies while the first circuit is in the reference mode. The attenuation state equivalent circuit of FIG. 1C is fitted with a data subset that includes the determined value for the nominal resistance Rs for the two resistors, the determined value for the sum of Rp and $R_{MAon}$, and the specified of the characteristic impedance $Z_0$ and the magnitude of attenuation in decibel $A(\omega)$ of the first circuit at various operating frequencies while the first circuit is in the attenuation mode.

At the end of the fitting, numerical values are determined for each of the on-state reference resistance $R_{MRon}$ the off-state reference capacitance $C_{MRoff}$, the on-state attenuation resistance $R_{MAon}$, and the off-state attenuation capacitance $C_{MAoff}$. The fitting can also determine the value for the capacitance $C_A$ of the phase compensating capacitor in the complex impedance circuit CIC. Once the numerical value for the on-state reference resistance $R_{MRon}$ is determined, the resistance Rp of the resistor in the complex impedance circuit CIC can be determined, which is given by:

$$Rp = 2Z_0 \times \left( \frac{10^{A/20}}{10^{A/20} - 1} \right) - R_{MAon}.$$

Referring to step 340, the forward voltage gain S21 of the S parameter is calculated for a reference path and an attenuation path. The reference path refers to the signal path from the first node N1 to the second node N2 while the first circuit is in the reference mode, i.e., while the reference transistor MR is turned on and the attenuation transistor MA is turned off. Thus, the reference path is the signal path from the first node N1 to the second node N2 in the reference state equivalent circuit of FIG. 1B. The attenuation path refers to the signal path from the first node N1 to the second node N2 while the first circuit is in the attenuation mode, i.e., while the reference transistor MR is turned off and the attenuation transistor MA is turned on. Thus, the attenuation path is the signal path from the first node N1 to the second node N2 in the attenuation state equivalent circuit of FIG. 1C.

In general, S-parameters (or "scattering parameters" as known in the art) describe the electrical behavior of a linear electrical circuit subjected to steady state electrical input signals. Many electrical properties of an electrical circuit may be expressed using S-parameters, such as gain, return loss, voltage standing wave ratio, reflection coefficient and amplifier stability. Although applicable at any frequency, S-parameters are mostly used for circuits operating at radio frequency (RF), microwave frequencies and higher where signal power and energy considerations are more easily quantified than currents and voltages. S-parameters are readily represented in matrix form and obey the rules of matrix algebra.

The first circuit of FIG. 1A and the equivalent circuits of FIGS. 1B and 1C have two signal nodes, i.e., the first node N1 and the second node N2. In this case, a first S parameter set for the reference state equivalent circuit of FIG. 1B can be a first 2×2 matrix, and a second S parameter set for the attenuation state equivalent circuit of FIG. 1C can be a second 2×2 matrix. During the construction of the matrices, the capacitance $C_A$ of the phase compensating capacitor in the complex impedance circuit CIC is set as a variable. Method of constructing the S parameter for a circuit including one variable capacitance is known in the art.

Specifically, a forward voltage gain S21 of the S parameter is calculated by employing the capacitance $C_A$ of the phase compensating capacitor in the complex impedance circuit CIC as a single variable in the formula for each equivalent circuit in FIGS. 1B and 1C. The forward voltage gain S21 of the S parameter is one of the four components in each of the first 2×2 matrix and the second 2×2 matrix. The forward voltage gain S21 of the S parameter for the reference state equivalent circuit of FIG. 1B is herein referred to as a reference state forward voltage gain S21_reference, and the forward voltage gain S21 of the S parameter for the attenuation state equivalent circuit of FIG. 1C is herein referred to as an attenuation state forward voltage gain S21_attenuation. Since all numerical values are known for the resistances and capacitances of the components of the reference state equivalent circuit of FIG. 1B and for the resistances and capacitances of the components of the attenuation state equivalent circuit of FIG. 1C, a numerical formula for the reference state forward voltage gain (S21_reference) and a numerical formula for the attenuation state forward voltage gain (S21_attenuation) can be generated, for example, employing a computing device, which can be a computer including a processor unit and memories.

Referring to step 350, computations can be performed, employing a computing device, to determine the values for the reference state forward voltage gain S21_reference and the attenuation state forward voltage gain S21_attenuation as a function of an operational frequency (i.e., the frequency of the applied signal at the first node N1) for a set of discrete values for the capacitance $C_A$ of the phase compensating capacitor in the complex impedance circuit CIC.

In one embodiment, the computations can be performed employing the technique of numerical simulation. A wide range of values for the capacitance $C_A$ can be tried to run the numerical simulations. The range of values for the capacitance $C_A$ can be, for example, from $0.01/(\omega\_max \times Rp)$ to $100/(\omega\_min \times Rp)$, in which $\omega\_max$ is the maximum angular frequency of the applied signal in the operating range of the first circuit, and $\omega\_min$ is the minimum angular frequency of the applied signal in the operating range of the first circuit. In one embodiment, the operating range of the first circuit can be between 2 GHz and 200 GHz.

A target value for the capacitance $C_A$ of the phase compensating capacitor in the complex impedance circuit CIC in the first circuit can be determined such that the phase difference between the reference state forward voltage gain S21_reference and the attenuation state forward voltage gain S21_attenuation is minimized or maintained within a predefined range.

In one embodiment, the target value for the capacitance $C_A$ of the phase compensating capacitor in the complex impedance circuit CIC in the first circuit can be determined by employing a computing device such that the phase of the attenuated signal at the second node N2 while the reference transistor MR is turned off, i.e., while the first circuit in FIG. 1A is in an attenuation mode, is shifted toward the phase of a reference signal that is present at the second node N2 while the reference transistor MR is turned on, relative to the second circuit of FIG. 2A, i.e., the conventional circuit which differs from the first circuit by removing the phase compensating capacitor in the complex impedance circuit CIC. Thus, the target value for the capacitance $C_A$ of the phase compensating capacitor in the complex impedance circuit CIC in the first circuit can be determined such that the difference between the phases of the reference signal and the attenuated signal in two different modes of the first circuit is reduced relative to the corresponding difference between the phases of the reference signal and the attenuated signal in two different modes of the second circuit.

In one embodiment, the value for the capacitance $C_A$ of the phase compensating capacitor in the complex impedance circuit CIC in the first circuit can be determined such that the attenuated signal is shifted in an entirety of an operational frequency range of the first circuit relative to the second circuit, i.e., the circuit derived from the attenuator circuit by removing the phase compensating capacitor. In one embodiment, the operational frequency range of the first circuit can include all frequencies between 2 GHz and 200 GHz. The value for the capacitance $C_A$ of the phase compensating capacitor in the complex impedance circuit CIC in the first circuit can be determined such that the attenuated signal is also shifted in operational frequencies less than 2 GHz or greater than 200 GHz.

In one embodiment, the shift in the attenuated signal in the first circuit of FIG. 1A relative to the second circuit of FIG. 2A can be greater than 1 degree throughout the entirety of the operating frequency range of the first circuit.

In one embodiment, the value for the capacitance $C_A$ of the phase compensating capacitor in the complex impedance circuit CIC in the first circuit can be determined such that the difference between the phase of the attenuated signal and the phase of the reference signal can be, for example, in a range between $-2$ degrees to $+2$ degrees in an entirety of a frequency range from 10 GHz to 20 GHz.

Referring to step 360, the circuit design and the values for the various components in the first circuit can be stored in a non-transitory machine-readable data storage medium, which can be, for example, a magnetic recording medium such as a magnetic tape or a hard disc, an optical recording medium such as a CD ROM or a DVD ROM, an electronic recording medium such as a flash memory device, or any other known non-transitory machine readable data storage medium known in the art.

A physical attenuator circuit can be built, and subsequently utilized, employing the circuit design and the values for the various components in the first circuit. The physical attenuator circuit can be implemented on a semiconductor substrate employing known methods for manufacturing semiconductor device.

While the nominal resistance Rs for the two resistors in the series connection of the two resistors in the first circuit is the same, the two resistors Rs in a physical implementation of the first circuit can have a resistance that is within 10% of the nominal resistance Rs that is equal to:

$$Z_0 \times \left( \frac{10^{A/20} - 1}{10^{A/20} + 1} \right).$$

Further, in the physical implementation of the first circuit can have a phase shift resistor in the complex impedance circuit CIC that has a resistance that is within 10% of the target value for the resistance Rp that is equal to:

$$2Z_0 \times \left( \frac{10^{A/20}}{10^{A/20} - 1} \right) - R_{MAon}.$$

Figure 4:
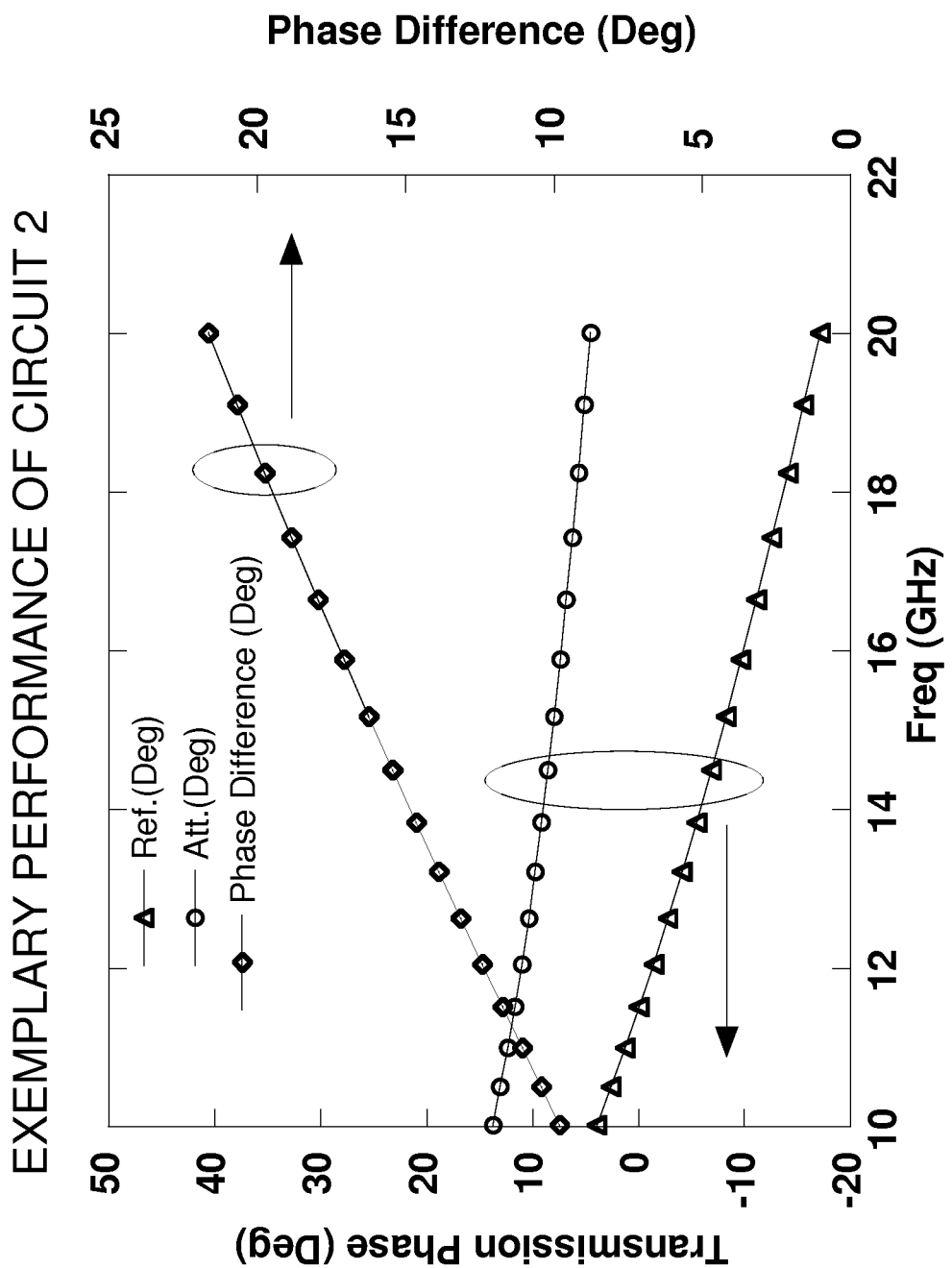
FIG. 4 illustrates exemplary performance in the phase of a reference signal and an attenuated signal, and in the phase difference between a reference signal and an attenuated signal, of an optimized second circuit.

Referring to FIG. 4, exemplary performance of an optimized second circuit is illustrated for the phases of a reference signal and an attenuated signal, and for the phase difference between the reference signal and the attenuated signal. The optimization was performed to reduce the phase difference between the reference signal and the attenuated signal through numerical simulations employing typical semiconductor device parameters for devices currently available for operation in the 10 GHz to 20 GHz range.

Within the frequency range between 10 GHz and 20 GHz, the phase shift of the reference signal at the second node N2 relative to the phase of the applied signal at the first node N1 within the second circuit ranges from +4 degrees to −16 degrees. Within the same frequency range, the phase shift of the attenuated signal at the second node N2 relative to the phase of the applied signal at the first node N1 within the second circuit ranges from +14 degrees to +4 degrees.

The difference between the phase of the reference signal and the phase of the attenuated signal ranges from 10 degrees to 20 degrees.

Figure 5A:
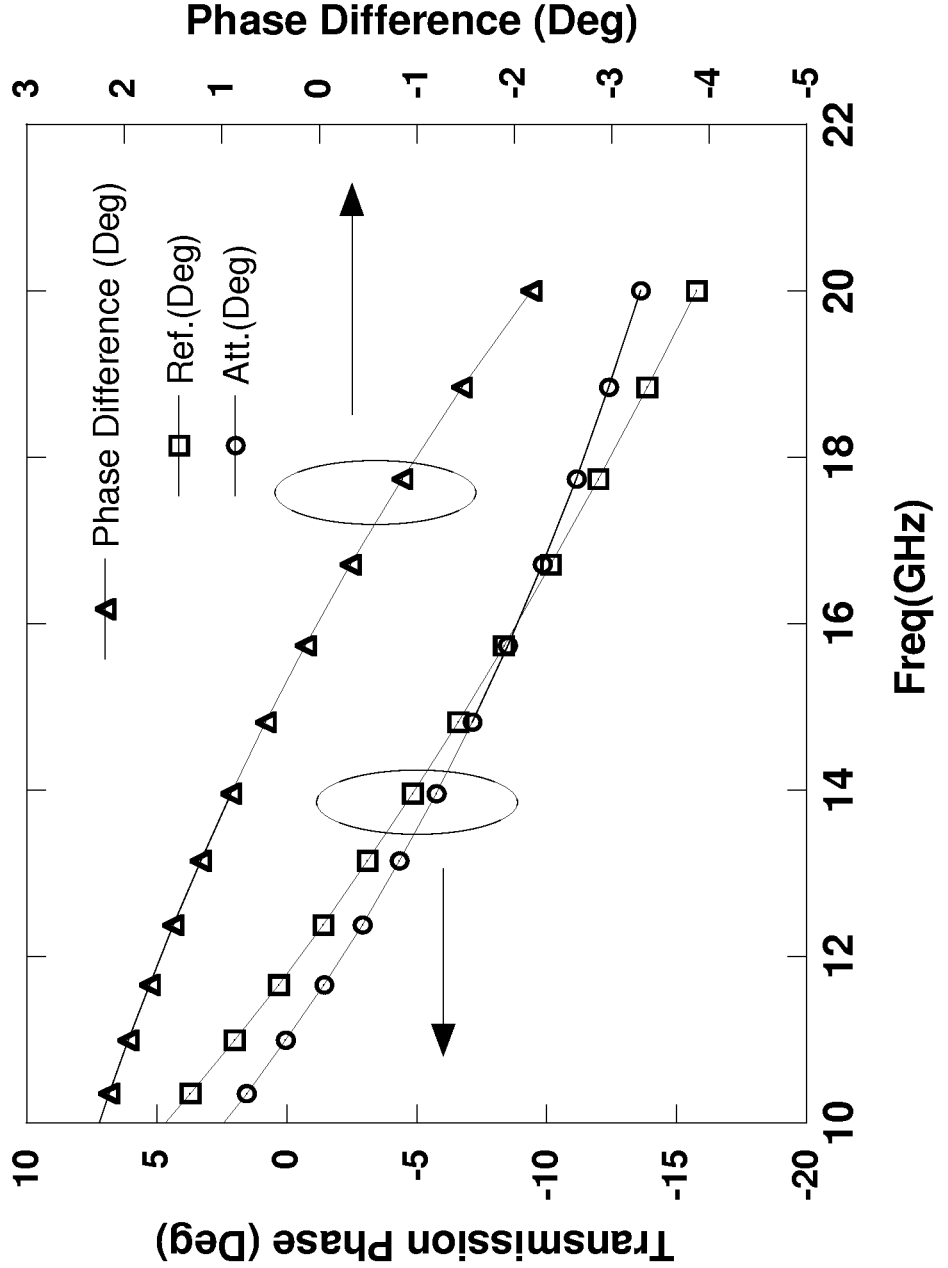
FIG. 5A illustrates exemplary performance for the phase of a reference signal and an attenuated signal, and for the phase difference between the reference signal and the attenuated signal, of an optimized first circuit.

Referring to FIG. 5A, exemplary performance of an optimized first circuit is illustrated for the phases of a reference signal and an attenuated signal, and for the phase difference between the reference signal and the attenuated signal. The optimization was performed to reduce the phase difference between the reference signal and the attenuated signal through numerical simulations employing typical semiconductor device parameters for devices currently available for operation in the 10 GHz to 20 GHz range and by varying, and subsequently determining and selecting, the capacitance $C_A$ of the phase compensating capacitor in the complex impedance circuit CIC in the first circuit.

Within the frequency range between 10 GHz and 20 GHz, the phase shift of the reference signal at the second node N2 relative to the phase of the applied signal at the first node N1 within the first circuit ranges from +5 degrees to −16 degrees. Within the same frequency range, the phase shift of the attenuated signal at the second node N2 relative to the phase of the applied signal at the first node N1 within the first circuit ranges from +3 degrees to −14 degrees.

The difference between the phase of the reference signal and the phase of the attenuated signal ranges from +2 degrees to −2 degrees.

Figure 5B:
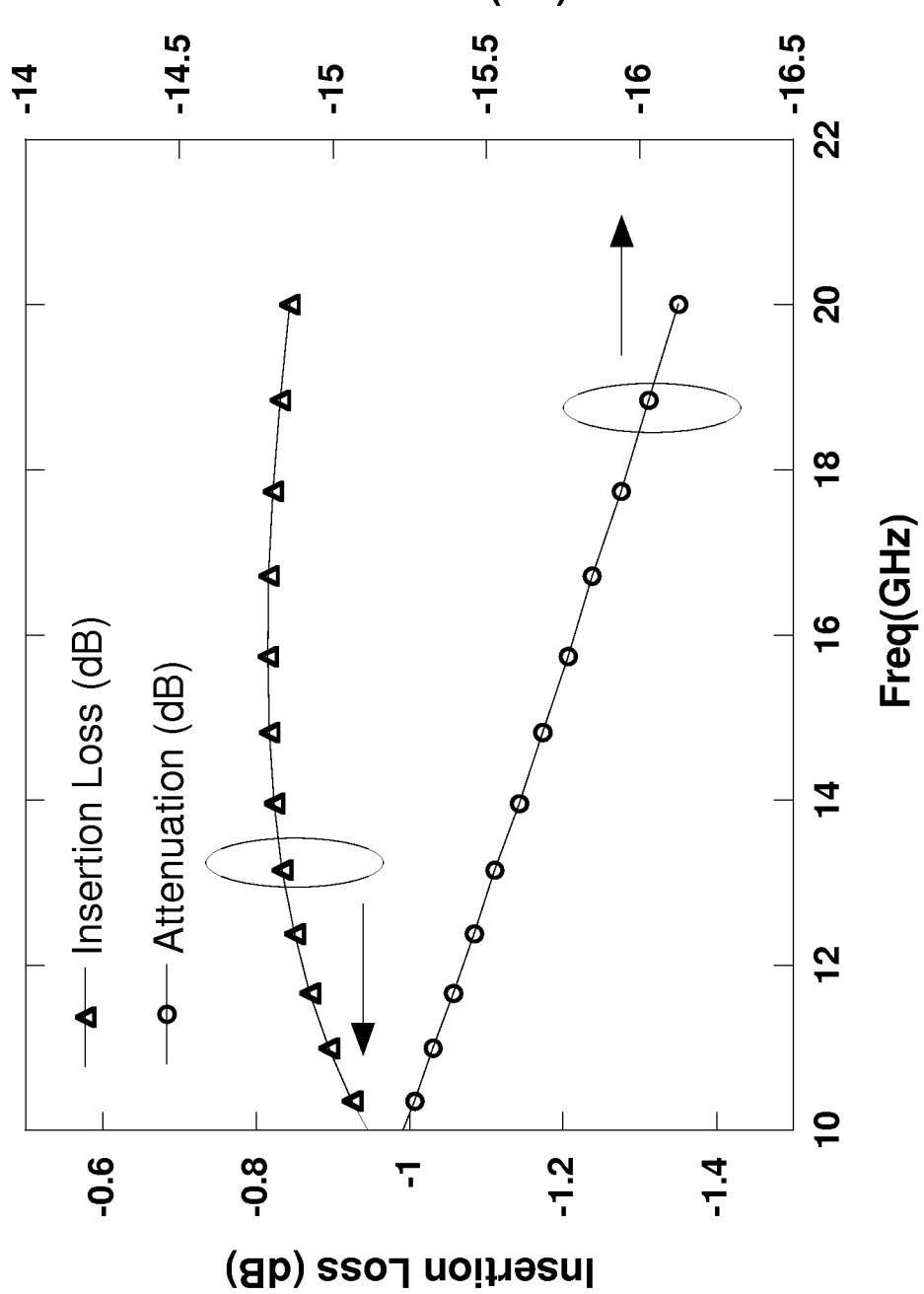
FIG. 5B illustrates exemplary performance for insertion loss and attenuation of the optimized first circuit.

Referring to FIG. 5B, exemplary performance for insertion loss and attenuation of the optimized first circuit is illustrated. Insertion loss, which is the 20 times logarithm to base 10 of the ratio of the magnitude of the reference signal at the second node N2 to the magnitude of the applied signal at the first node N1 in the reference mode of the first circuit, is better than −1 dB. Thus, there is no substantial loss of the reference signal at the second node N2 of the first circuit relative to the applied signal at the first node N1 of the first circuit. The attenuation, which is the 20 times logarithm to base 10 of the magnitude of the attenuated signal at the second node N2 to the magnitude of the applied signal at the first node N1 in the attenuation mode, is around −15 dB. Thus, the first circuit provides sufficient attenuation to the attenuated signal in order to function as an attenuator.

As illustrated in FIGS. 5A and 5B, the first circuit can be optimized, by determining the capacitance $C_A$ of the phase compensating capacitor in the complex impedance circuit CIC in the first circuit employing the methods described above, to provide an attenuator circuit in which the difference between the phase of the attenuated signal and the phase of the reference signal is in a range between −2 degrees to +2 degrees in an entirety of a frequency range from 10 GHz to 20 GHz.

Figure 6:
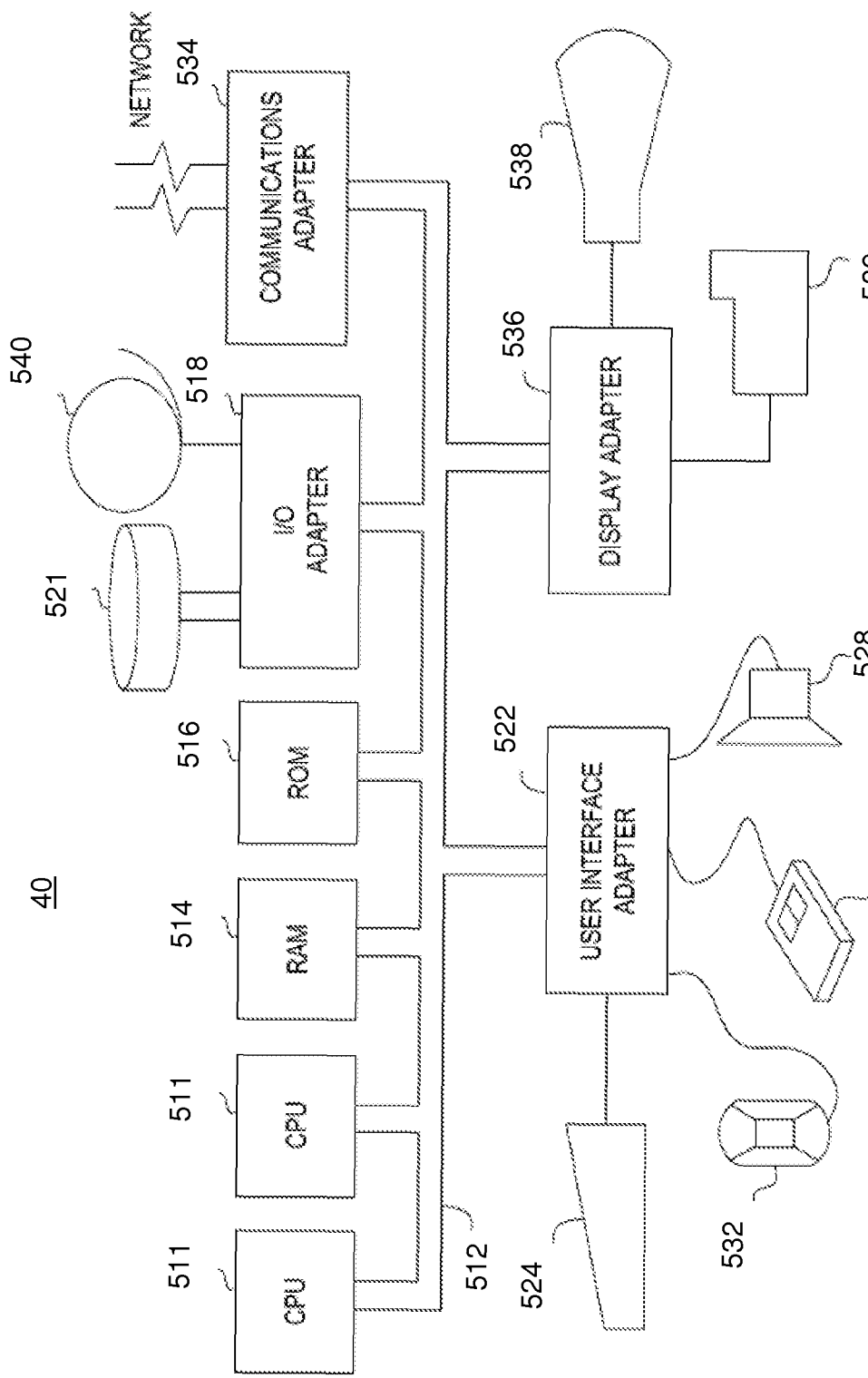
FIG. 6 illustrates an exemplary hardware configuration of a computing device that can be employed to calculate values for components of the circuits of the present disclosure.

FIG. 6 illustrates an exemplary hardware configuration of the computing device 40 that can be employed to perform the calculations at steps 320, 330, 340, and 350 in the flowchart in FIG. 3. The hardware configuration preferably has at least one processor or central processing unit (CPU) 511. The CPUs 511 are interconnected via a system bus 512 to a random access memory (RAM) 514, read-only memory (ROM) 516, input/output (I/O) adapter 518 (for connecting peripheral devices such as disk units 521 and tape drives 540 to the bus 512), user interface adapter 522 (for connecting a keyboard 524, mouse 526, speaker 528, microphone 532, and/or other user interface device to the bus 512), a communication adapter 534 for connecting the system 500 to a data processing network, the Internet, an Intranet, a local area network (LAN), etc., and a display adapter 536 for connecting the bus 512 to a display device 538 and/or printer 539 (e.g., a digital printer of the like).

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with a system, apparatus, or device running an instruction.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with a system, apparatus, or device running an instruction.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may run entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which run via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which run on the computer or other programmable apparatus provide processes for implementing the functions/acts specified in the flowchart and/or block diagram block or blocks.

The drawing of the instant disclosure illustrate the architecture, functionality, and operation of possible implementations of systems, methods and computer program products according to various embodiments of the present disclosure. In this regard, each block in the flowchart or block diagrams may represent a module, segment, or portion of code, which comprises one or more operable instructions for implementing the specified logical function(s). It should also be noted that, in some alternative implementations, the functions noted in the block may occur out of the order noted in the figures. For example, two blocks shown in succession may, in fact, be run substantially concurrently, or the blocks may sometimes be run in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. An attenuator circuit comprising:
   a parallel connection of a reference transistor and two resistors between a first node and a second node; and
   a series connection of an attenuation transistor and a complex impedance circuit, wherein a third node at one end of said series connection is a node between said two resistors, and a fourth node at another end of said series connection is electrically grounded, and wherein said complex impedance circuit is a parallel connection of a resistor and a capacitor.

2. The attenuator circuit of claim 1, further comprising an antenna connected to said first node.

3. The attenuator circuit of claim 1, wherein said two resistors have resistance values that are within 20% of each other.

4. The attenuator circuit of claim 3, wherein said two resistors have a resistance that is within 10% of a first resistance value Rs given by $$Rs = Z_0 \times \left(\frac{10^{A/20} - 1}{10^{A/20} + 1}\right),$$

wherein $Z_0$ is a characteristic impedance, and A is a magnitude of attenuation in decibel, measured in decibels in a direct current mode, of an amplitude of an attenuated signal that is present at said second node while said reference transistor is turned off relative to a reference signal that is present at said second node while said reference transistor is turned on.

5. The attenuator circuit of claim 4, wherein said resistor has a resistance that is within 10% of a second resistance value Rp given by $$Rp = 2Z_0 \times \left(\frac{10^{A/20}}{10^{A/20} - 1}\right) - R_{MAon},$$

wherein $R_{mAon}$ is an on-state resistance of said attenuation transistor.

6. The attenuator circuit of claim 5, wherein said capacitor has a capacitance value that provides a difference between said phase of said attenuated signal and said phase of said reference signal is in a range between −2 degrees to +2 degrees in an entirety of a frequency range from 10 GHz to 20 GHz.

7. The attenuator circuit of claim 1, wherein a capacitance of said capacitor shifts a phase of an attenuated signal that is present at said second node while said reference transistor is turned off toward a phase of a reference signal that is present at said second node while said reference transistor is turned on, relative to a circuit derived from said attenuator circuit by removing said capacitor.

8. The attenuator circuit of claim 7, wherein said capacitance shifts said attenuated signal in an entirety of a frequency range between 2 GHz and 200 GHz relative to said circuit derived from said attenuator circuit by removing said capacitor.

9. The attenuator circuit of claim 7, wherein a difference between said phase of said attenuated signal and said phase of said reference signal is in a range between −2 degrees to +2 degrees in an entirety of a frequency range from 10 GHz to 20 GHz.

10. A method of designing an attenuator circuit comprising:
    generating a circuit design for an attenuator circuit, said attenuator circuit including:
    a parallel connection of a reference transistor and two resistors between a first node and a second node, and
    a series connection of an attenuation transistor and a complex impedance circuit, wherein a third node at one end of said series connection is a node between said two resistors, and a fourth node at another end of said series connection is electrically grounded, wherein said complex impedance circuit is a parallel connection of a resistor and a capacitor;

determining, employing a computing device, values for components of said attenuator circuit including values of components in said complex impedance circuit; and storing said circuit design and said values in a non-transitory machine-readable data storage medium.

11. The method of claim 10, further comprising designing an antenna connected to said first node.

12. The method of claim 10, wherein said complex impedance circuit is a parallel connection of a resistor and a capacitor, and said method comprises determining values for a resistance of said resistor and a capacitance of said capacitor.

13. The method of claim 12, further comprising determining a same target resistance value for said two resistors.

14. The method of claim 13, said same target resistance value is a first resistance value Rs given by $$Rs = Z_0 \times \left( \frac{10^{A/20} - 1}{10^{A/20} + 1} \right),$$

wherein $Z_0$ is a characteristic impedance, and A is a magnitude of attenuation in decibel, measured in decibels in a direct current mode, of an amplitude of an attenuated signal that is present at said second node while said reference transistor is turned off relative to a reference signal that is present at said second node while said reference transistor is turned on.

15. The method of claim 14, wherein said resistor has a target resistance value Rp given by $$Rp = 2Z_0 \times \left( \frac{10^{A/20}}{10^{A/20} - 1} \right) - R_{MAon},$$

wherein $R_{mAon}$ is an on-state resistance of said attenuation transistor.

16. The method of claim 15, further comprising determining a capacitance value for said capacitor such that a difference between said phase of said attenuated signal and said phase of said reference signal is in a range between −2 degrees to +2 degrees in an entirety of a frequency range from 10 GHz to 20 GHz.

17. The method of claim 12, further comprising determining, employing said computing device, a value for said capacitance of said capacitor such that a phase of an attenuated signal at said second node while said reference transistor is turned off is shifted toward a phase of a reference signal that is present at said second node while said reference transistor is turned on, relative to a circuit derived from said attenuator circuit by removing said capacitor.

18. The method of claim 17, wherein said value for said capacitance is determined such that said attenuated signal is shifter in an entirety of a frequency range between 2 GHz and 200 GHz relative to said circuit derived from said attenuator circuit by removing said capacitor.

19. The method of claim 17, wherein said value for said capacitance is determined such that a difference between said phase of said attenuated signal and said phase of said reference signal is in a range between −2 degrees to +2 degrees in an entirety of a frequency range from 10 GHz to 20 GHz.

* * * * *